(12) United States Patent
Linow

(10) Patent No.: US 8,436,523 B2
(45) Date of Patent: May 7, 2013

(54) INFRARED EMITTER ARRANGEMENT FOR HIGH-TEMPERATURE VACUUM PROCESSES

(75) Inventor: Sven Linow, Darmstadt (DE)

(73) Assignee: Heraeus Noblelight GmbH, Hanau (DE)

( * ) Notice: Subject to any disclaimer, the term of this patent is extended or adjusted under 35 U.S.C. 154(b) by 0 days.

(21) Appl. No.: 13/140,609

(22) PCT Filed: Nov. 13, 2009

(86) PCT No.: PCT/EP2009/008076
§ 371 (c)(1),
(2), (4) Date: Jun. 17, 2011

(87) PCT Pub. No.: WO2010/069438
PCT Pub. Date: Jun. 24, 2010

(65) Prior Publication Data
US 2011/0248621 A1 Oct. 13, 2011

(30) Foreign Application Priority Data
Dec. 19, 2008 (DE) .......................... 10 2008 063 677

(51) Int. Cl.
*H01J 5/00* (2006.01)
(52) U.S. Cl.
USPC ................. 313/317; 313/318.07; 313/315
(58) Field of Classification Search .................. 313/317, 313/635, 489, 318.07, 318.01, 318.11
See application file for complete search history.

(56) References Cited

U.S. PATENT DOCUMENTS

| | | | |
|---|---|---|---|
| 4,918,355 A | 4/1990 | Morris et al. | |
| 5,252,132 A | 10/1993 | Oda et al. | |
| 5,689,154 A * | 11/1997 | Barthelmes et al. | 313/635 |
| 7,345,427 B2 * | 3/2008 | Henninger et al. | 313/635 |
| 2002/0047611 A1 * | 4/2002 | Kaneko et al. | 315/246 |
| 2002/0093289 A1 * | 7/2002 | Petrick | 315/149 |
| 2002/0148824 A1 | 10/2002 | Hauf et al. | |
| 2004/0104678 A1 * | 6/2004 | Bigio et al. | 313/635 |
| 2005/0116608 A1 * | 6/2005 | Haacke et al. | 313/489 |
| 2006/0152155 A1 * | 7/2006 | Henninger et al. | 313/573 |
| 2008/0036384 A1 * | 2/2008 | Chowdhury et al. | 313/635 |
| 2010/0315002 A1 * | 12/2010 | Schmidt | 315/70 |

FOREIGN PATENT DOCUMENTS

| | | |
|---|---|---|
| DE | 10 2004 002 357 A1 | 8/2005 |
| DE | 10 2004 051 846 A1 | 3/2006 |
| DE | 202007017598 U1 * | 7/2008 |
| EP | 0848575 A1 | 6/1998 |
| GB | 817908 A | 8/1959 |
| JP | 2006108526 A | 4/2006 |

OTHER PUBLICATIONS

Int'l Search Report Issued May 10, 2010 in Int'l Application No. PCT/EP2009/008076.

* cited by examiner

*Primary Examiner* — Mariceli Santiago
*Assistant Examiner* — Glenn Zimmerman
(74) *Attorney, Agent, or Firm* — Panitch Schwarze Belisario & Nadel LLP

(57) ABSTRACT

An infrared emitter has at least one emitter tube (11) having pinched sections at each of its ends. At least one opaque tube portion (12) is arranged in a manner welded in alignment with the at least one emitter tube. The infrared emitter may be installed in a processing chamber (21).

10 Claims, 4 Drawing Sheets

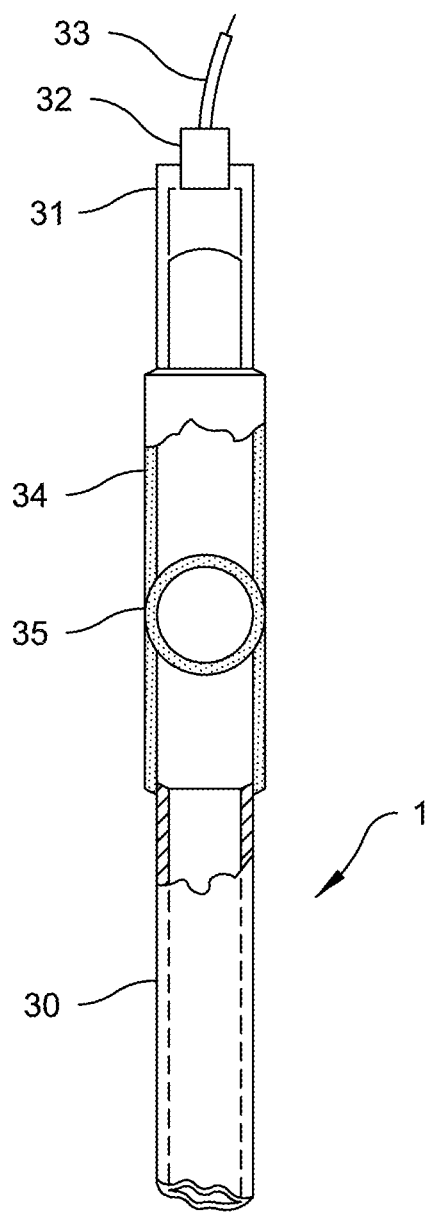
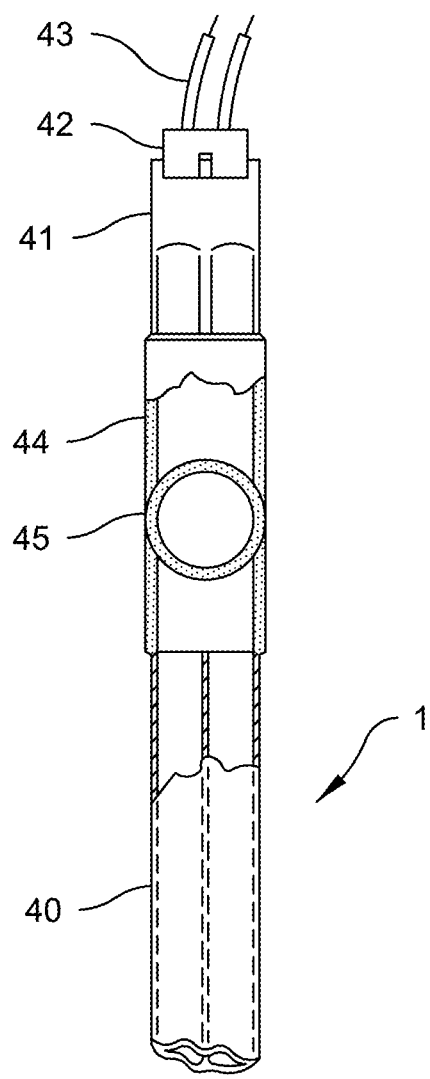
*Fig. 3a*  *Fig. 3b*

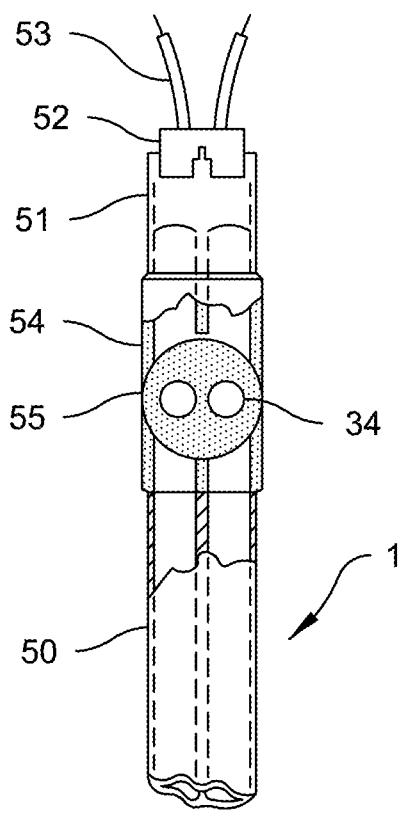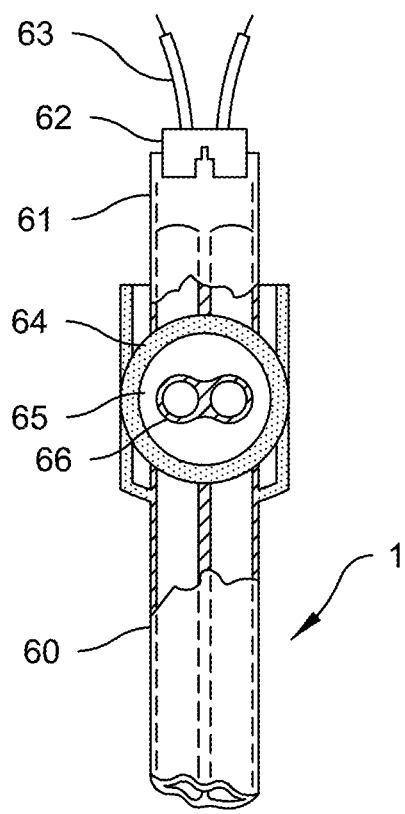
*Fig. 3c*          *Fig. 3d*

INFRARED EMITTER ARRANGEMENT FOR HIGH-TEMPERATURE VACUUM PROCESSES

CROSS-REFERENCE TO RELATED APPLICATIONS

This application is a Section 371 of International Application No. PCT/EP2009/008076, filed Nov. 13, 2009, which was published in the German language on Jun. 24, 2010, under International Publication No. WO 2010/069438 A1 and the disclosure of which is incorporated herein by reference.

BACKGROUND OF THE INVENTION

The invention relates to an arrangement for infrared emitters having at least one emitter tube.

The operation of infrared emission elements in a vacuum, in vacuum processes with reactive atmospheres, or in corrosive or reactive atmospheres, as for example, coating processes, Chemical Vapor Deposition, Physical Vapor Deposition, etching in the gas phase, the fabrication of thin-film solar cells in CIS technology, and RTP processes, in which a considerable quantity of heat is to be introduced into a substrate in a very short time, and thus a combination of a vacuum or an atmosphere of hot, corrosive gases having high quantities of released heat and cyclical loading, represents a particular demand on the components and materials being used.

Even with the use of IR heating elements made of the quartz-tube type, in which the outer sleeve of the emitter is made of a tube of quartz glass, which is resistant to heat and to nearly all atmospheres, nearly all of the technical hurdles remain. These are, among other things, the corrosion of the electrical feed lines to the emitters when these are carried out in a corrosive atmosphere or in a vacuum.

Sparkovers between the electrical feed lines among each other or to the chamber wall occur in certain pressure regions, when the feed lines are constructed in the chamber. With use of heat emitters in sleeve tubes, wherein the sleeve tubes represent parts of the wall of the processing chamber, a problem of heat accumulation is quickly generated, which leads to the destruction of the emitter or at least limits the maximum output of the emitter being used. With use of the sleeve tube solution, the maximum output to be realized is limited both thermally by the heat accumulation in the sleeve tube and also geometrically by the necessarily large distances between the sleeve tubes.

European Patent EP 1 228 668 B1 describes an arrangement in which at least one infrared emitter is arranged in a sleeve tube. The sleeve tube is here sealed relative to the vacuum chamber and also protects the emitter from reactive gases, which possibly appear in the chamber. A disadvantage, however, is that the emitters in such a sleeve tube quickly overheat and can be destroyed, because the sleeve tube must already have a considerable temperature, in order to be able to discharge heat to the surroundings via radiation.

The possibility indicated in the publication of adequately cooling the emitter by an air flow through the sleeve tube can usually not be used in real, technical applications, because an electrical connection would no longer be allowed at the outlet of the hot air—this connection would overheat. Only twin-tube emitters with one-side electrical connection come into question, which also reduces the maximum possible output. Air cooling also leads to a temperature gradient along the sleeve tube. Because the sleeve tubes also act as secondary IR emitters in the far IR and thus contribute to the application of energy into the substrate, a gradient of the temperature of the sleeve tube can be noted as the gradient of the incoming power onto the substrate, which cannot be tolerated in many processes.

Due to the narrow installation spaces and dimensions that are needed, in order to obtain homogeneous radiation sources and radiation fields of higher surface-area power, there is only a narrow gap between the wall and emitter in the sleeve tube. Therefore, the wall temperature of the emitter is considerably higher than that of an emitter located directly in the vacuum or that of an emitter cooled by convection.

If water is used as the cooling agent, then the problem of the temperature gradient in the sleeve tube can indeed be avoided. The use of water, however, can be realized only in a separate tube, because the electrical feed lines should not be constructed lying in water. Here, water absorbs a minimum of approximately 50% of the total emitter power, wherein this water is usually arranged in the gap between the emitter and sleeve tube or at a comparable position. In addition, water can be used only in those cases where the wall temperature of the sleeve tube may be low and where the additional heating of the sleeve tube is not needed for the process.

German published patent application DE 10 2004 002 357 A1 likewise describes active cooling, which is, however, technically very expensive.

A symmetrically arranged air guide (in which, e.g., air is blown centrally into the sleeve tube via an additional tube or even at many positions over the length of the sleeve tube) can move only a small quantity of air and thus can achieve only minimal cooling. In addition, it is very expensive in terms of energy to use compressed air. Typically, air is blown economically via fans, whereby initial pressures up to about 0.3 bars can be achieved. With compressors, air can be blown at a few bars of overpressure (the quantity of air is then limited by effects of compressibility). Nevertheless, inhomogeneities would also not be able to be ruled out here. In addition, complicated and expensive devices are used for controlling the cooling.

The assembly and electrical contacting of infrared emitters directly in the processing chamber also rarely appears advantageous. For example, in order to avoid voltage sparkovers or discharging in the chamber, the voltage must be kept lower than 80 volts, especially in the presence of an ion source of a plasma or in the pressure range on the order of magnitude of 10 Pascals to approximately 10,000 Pascals. Indeed, the maximum possible voltages that can be read from the Paschen curves of the processing gases are somewhat higher than this 80V, but experience has shown that sparkovers are actually avoided only below this limit. Such a low operating voltage considerably limits the possible electrical output of the infrared emitter, because depending on the type of construction, the current possible for each emitter is also limited. Thus, many emitters of lower output are needed, which then must be operated at non-typical operating voltages. This means that, among other things, an expensive and heavy transformer is needed for the generation of the voltage.

With the use of infrared emitters in corrosive atmospheres, the electrical feed lines could be attacked, especially the molybdenum film, which is located in the pinched section and is extremely sensitive. Here, a use can be completely impossible.

In order to accommodate the emitter ends and the electrical lines, it is further necessary to provide additional, not insignificant space in the vacuum chamber, which is usually limited or expensive, if all of the emitters with feed lines are to be accommodated in the vacuum chamber.

The simple passing of the emitter through the wall and the direct sealing of the emitter requires very strong cooling of the seal, because the seal is exposed to extreme thermal loading due to the high radiation powers found in the emitter tube. In quartz tubes, a considerable radiation power is transported in the axial direction of the tube, similarly as in an optical fiber.

The formation of flanges directly on the emitter tube is therefore extremely complicated. Such flanges must also be supported so that they move in the direction of the emitter axis against the chamber wall, in order not to convert slight thermal expansions into a tensile stress that is destructive for the emitter tube. Because the thermal expansion of the quartz glass is approximately one order of magnitude lower than that of the metallic chamber wall, even slight variations of the temperature of the chamber wall can lead to tensile loading that is destructive for quartz glass.

BRIEF SUMMARY OF THE INVENTION

An object of the invention is therefore to provide an arrangement of infrared emitters in processing chambers or vacuum chambers, in which the above-mentioned disadvantages are avoided and a structurally simple solution is provided, which likewise allows a long service life of the emitter.

The infrared emitter according to the invention comprises at least one emitter tube, which has pinched sections on each of its ends, wherein at least one opaque tube section is welded in alignment with the at least one emitter tube and is located between the pinched section and emitter tube.

Such an infrared emitter allows it to be installed, without an additional sleeve tube, directly in a chamber for vacuum processes with reactive atmospheres or directly in a vacuum.

Advantageously, the infrared emitter according to the invention has opaque tube sections before the pinched sections, with these opaque tube sections simultaneously serving as vacuum bushings against which the emitter is sealed. The opaque tube sections reduce the radiation power found in the tube toward the ends (toward the pinched sections), so that the seals cannot become overheated. Thus, with an emitter guided on only one end into the vacuum chamber (twin tube, one-side connection), such an opaque tube section can also be used only on one end, while with emitters having two-side electrical connections, two-end vacuum bushings are also required.

In one advantageous embodiment, the invention provides that the opaque tube sections are round on the outside.

Advantageously, the opaque tube sections have at least one drill hole on the inside.

In another advantageous embodiment, the invention provides that a disk is arranged between the opaque tube sections and the emitter tube. Advantageously, the disk contains quartz glass.

For an especially easy assembly of emitters sealed on two ends, the diameter of the two sealing faces can also be constructed differently. For assembly, the first sealing face still slides easily through the flange provided for the second seal, because it has a somewhat smaller diameter.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIGS. 3a, 3b, 3c, 3d are partial sectional views of different variants of round tube emitters according to embodiments of the invention.

DETAILED DESCRIPTION OF THE INVENTION

Figure 1:
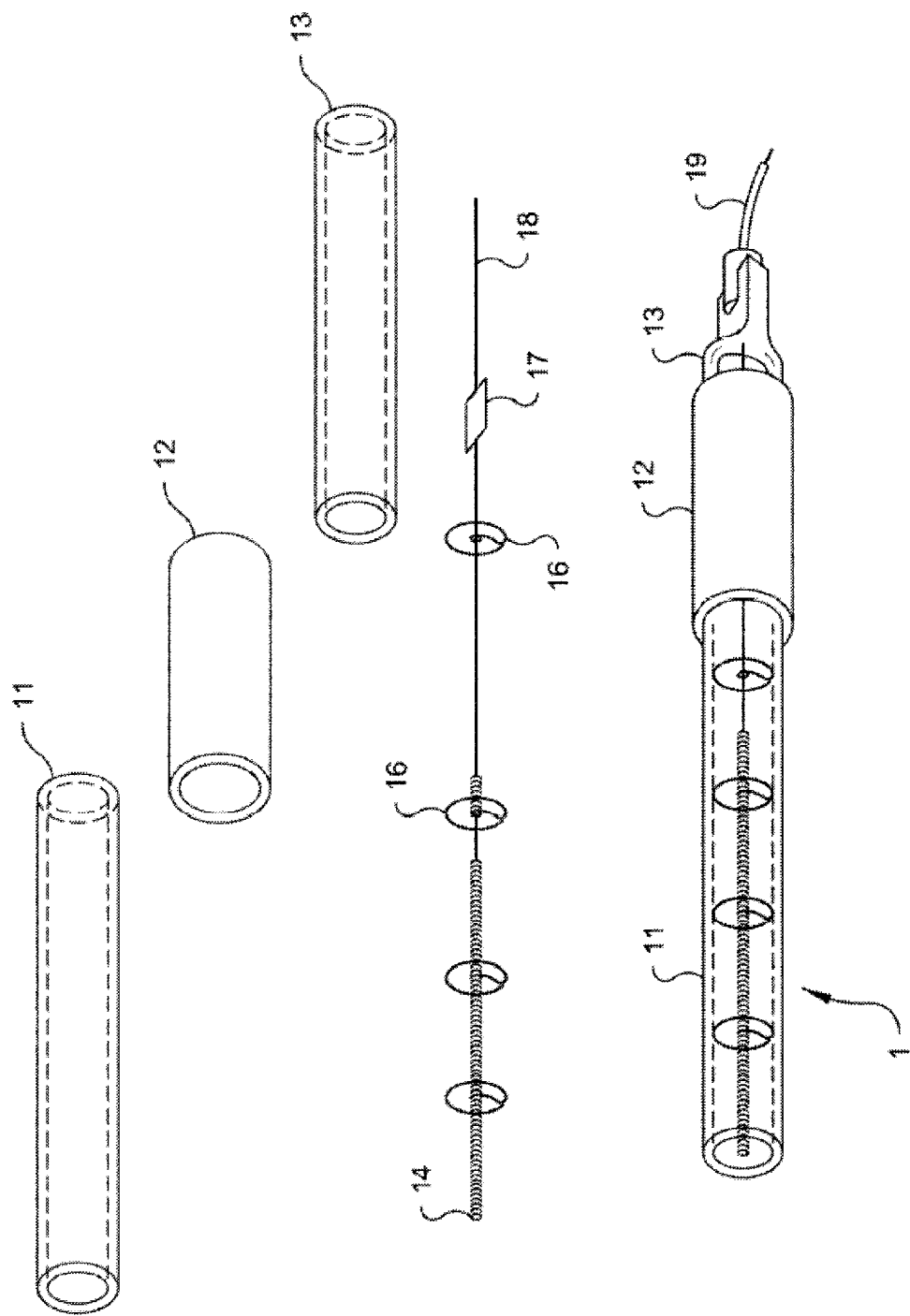
FIG. 1 is a series of perspective views of parts of a round tube emitter according to an embodiment of the invention, shown in assembled and disassembled form.

FIG. 1 shows a round tube emitter for use in a vacuum chamber comprising a central emitter tube 11, which is made of transparent quartz glass. The round tube emitter has a diameter of 1.5×14 mm (i.e., a wall thickness of 1.5 mm and a tube outer diameter of 14 mm) and its length is approximately 2 to 5 cm shorter than the open width of the vacuum chamber in which it is installed.

At each of the two ends of the central emitter tube 11 there is an opaque tube section 12, which can be placed aligned at the ends, for example by a glass turning machine. The dimensions of the opaque tube section 12 equal in this case 3×16 mm. The length of the sections results from the section to be bridged in the chamber from 10 mm to 25 mm and the thickness of the chamber wall including the seal of typically about 50 mm for a simple chamber wall without thermal screens or insulation, so that a typical length of 60 mm to 100 mm results. Furthermore, the round tube emitter comprises two transparent tube sections 13, which are likewise placed on the opaque tube sections 12 aligned in the axial direction on the outside by a glass turning machine. The transparent tube sections 13 have a diameter of 1.5×14 mm, wherein their length results from production-related parameters. The pinched section is formed in these tube sections 13 and, depending on the pinching method, additional dimensions to be cut after the pinching are needed outside of the pinched section (not shown here).

The round tube emitter constructed in this way likewise has a coil 14 within the emitter tube. The coil 14 is contacted with long rods 18 on a molybdenum film 17, which later serves, in a pinched state, for carrying the electrical current. On the rods 18 additional support rings 16 are applied, which support the rod 18 in the tubes 11 and 13. If needed, an electrical lead 19 for the current supply can be attached to the projecting rods 18 after the pinching.

Figure 2:
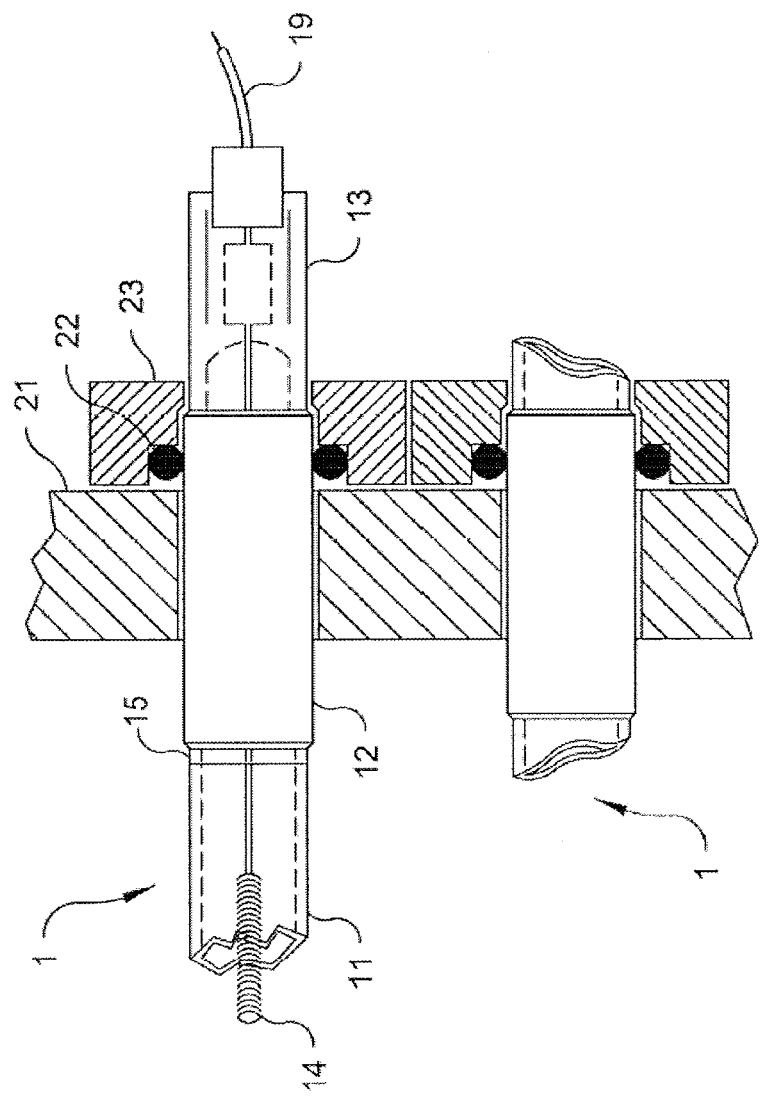
FIG. 2 is a sectional view of the seals of a pair of round tube emitters according to an embodiment of the invention.

An emitter 1 produced in this way can then be mounted, for example in a vacuum chamber, parallel to other emitters 1, as shown in FIG. 2. Here, the assembly is performed such that emitters 1 is are attached perpendicular to the direction in which the substrate 21 is transported. The sealing of the emitter is realized either on both ends with O-rings 22 or on one end by one O-ring and on the other end with a sliding conduit gland. In the pressing ring 23 on both ends, there is a bead that prevents the emitter from sliding out from its sealed position and thus fixes it in the vacuum chamber. Thus, according to the construction, an emitter spacing of 40 mm or even up to 30 mm can be achieved in a vacuum chamber. In this way, a higher number of emitters can be attached within the vacuum chamber in a simple way. FIG. 2 shows schematically the attachment of such emitters with the seals.

Another embodiment provides that an opaque tube section 12 with a diameter of 5×40 mm is placed in alignment by a glass turning machine on a twin tube with a diameter of 33×14 mm and a length given from the transverse dimension of the vacuum chamber. The transition from the opaque tube section 12 to the twin tube can be either freely formed or, in one advantageous embodiment as seen in FIG. 2, a planar disk 15 made of quartz glass can be placed on the twin tube, wherein this disk 15 serves for the transition from the twin tube to the opaque, round tube and is shaped accordingly. Another piece of twin tube 11 with a diameter of 33×14 mm is placed in alignment with this tube on the other end of the opaque tube section 12. From such an emitter tube, an emitter with one-side connection is produced. An emitter produced in this way can be mounted in a vacuum chamber, wherein the seal on the opaque tube section 12 is realized by an O-ring and the emitter 1 is fixed mechanically on the opposite side of the chamber, for example by a simple bracket clamp. The spacing of the emitter axes here equals at a minimum about 60 mm, when all seals are located on one chamber side. It is conceivable, however, that the emitters are inserted alternately on both sides into the chamber, whereby the spacing of the axes of the emitters 1 can be reduced to about 35 mm.

FIGS. 3a to 3d show different embodiments of the special sealing faces, wherein only one tube end is shown in each case. For simplification of the Figures, coils, rods, molybdenum films, etc., were left out.

FIG. 3a shows and explains in detail a round tube emitter 1 as already shown in FIG. 1. An emitter tube 30 has, on both ends in the completed state, pinched sections 31 and also ceramic caps 32 and electrical leads 33. In the vicinity of the pinched sections 31, opaque tube sections 35 have been welded parallel to the tubes as future sealing faces by a glass turning machine. For illustration, the cross section of the opaque tube section 34 on the emitter tube 30 is shown.

FIG. 3b shows a twin tube emitter, as already explained above. An emitter tube 40 has, on both ends in the completed state, pinched sections 41, ceramic caps 42, and electrical leads 43. In the vicinity of the pinched sections 41 there are, as future sealing faces, opaque tube sections 45 welded parallel to the tubes 44 by a glass turning machine. Here, either for the transition from the twin tube 40 to the opaque tube section 44 on both ends, a laser-cut disk, for example made of quartz glass, is used as a transition piece or the opaque tube 44 is shaped by a strong flame directly on the twin tube 40. Here, the cross section of the opaque tube section 44 is shown set on the twin tube 40.

FIG. 3c shows a twin tube emitter having an adapted, opaque tube section. The emitter tube 50 has on both ends pinched sections 51, ceramic caps 52, and also electrical leads 53. In the vicinity of the pinched sections 51, opaque tube sections 55 are welded parallel to the tubes 54 as future sealing faces by a glass turning machine. These tube sections 55 are round on the outside for optimal sealing of the vacuum chamber, and they have on the inside two drilled holes 34, which are similar to the dimensions of the two channels of the twin tube. Such an opaque tube piece could be easily cast and sintered, so that only the outer faces still need to be ground. In this way, the opaque tube piece can be set directly on the twin tube 55 without expensive glass-blowing shaping or without intermediate disks. The cross section of the opaque tube section 54 is shown on the twin tube 50.

FIG. 3d shows a twin tube emitter having a twin tube 60 and an opaque tube section 64 set on the outside. The emitter tube 60 has, on both ends in the completed state, pinched sections 61, ceramic caps 62, as well as electrical leads 63. Close to the position of the pinched sections 61, opaque tube sections 65 are welded parallel to the tubes 64 as future sealing faces by a glass turning machine. These tube sections are now connected to the twin tube emitter in a ring shape at one position. Preferably, here a laser-cut disk made of quartz glass is used with fitting dimensions. Therefore, a tube section must be inserted at only one position, which offers a certain amount of savings in production but leads to the result, however, that the diameter of the opaque tube section is somewhat larger. This has the result that the emitter spacings within the vacuum chamber are likewise larger.

The disclosed variants permit, in an especially simple and elegant way, the attachment of an additional reflector made of opaque quartz glass, as described in DE 10 2004 051 846. Such a reflector is especially well suited for the vacuum, but has typical thicknesses of 0.5 mm to 1.5 mm. Therefore, for the most part, a coated emitter can no longer be sealed against the emitter tube, because it no longer fits in the vacuum chamber through the drill hole provided for holding the emitter tube. As shown in FIGS. 3a to 3d, the sealing piece (34, 44, 54, 64) should have a somewhat larger diameter than the emitter tube. This diameter can easily be adapted according to the requirement of a deposited coating, so that in each case the emitter tube with a coating still has a smaller diameter than the sealing piece, and thus can be easily mounted and exchanged in each case.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. An infrared emitter, comprising at least one emitter tube having pinched sections at each of its ends and a coil disposed therein, and at least one opaque tube section arranged welded in alignment with the at least one emitter tube, the entire coil being longitudinally spaced apart from the at least one opaque tube section, and wherein at least one of the pinched sections is entirely spaced apart from the at least one emitter tube.

2. The infrared emitter according to claim 1, comprising two of the opaque tube sections, wherein one opaque tube section is arranged close to of the pinched sections.

3. The infrared emitter according to claim 1, wherein the at least one opaque tube section is arranged between one of the pinched sections and the at least one emitter tube.

4. The infrared emitter according to claim 1, wherein the at least one opaque tube section is round on its outside.

5. The infrared emitter according to claim 1, wherein the at least one opaque tube section has at least one drill hole on its inside.

6. The infrared emitter according to claim 1, further comprising a transition element arranged between the at least one opaque tube section and the at least one emitter tube.

7. The infrared emitter according to claim 6, wherein the transition element has a disk-shaped construction.

8. The infrared emitter according to claim 7, wherein the disk-shaped transition element comprises quartz glass.

9. The infrared emitter according to claim 1, wherein the infrared emitter is installed in a processing chamber.

10. The infrared emitter according to claim 9, wherein the processing chamber has a gas-tight and/or vacuum-tight construction in relation to its surroundings.

* * * * *